United States Patent
Ooka

(10) Patent No.: US 9,905,486 B2
(45) Date of Patent: Feb. 27, 2018

(54) METHOD FOR MANUFACTURING ORGANIC EL DISPLAY DEVICE, AND FILM THICKNESS MEASURING DEVICE

(71) Applicant: Japan Display Inc., Tokyo (JP)

(72) Inventor: Hiroshi Ooka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/078,447

(22) Filed: Mar. 23, 2016

(65) Prior Publication Data

US 2016/0284614 A1    Sep. 29, 2016

(30) Foreign Application Priority Data

Mar. 25, 2015    (JP) .................. 2015-062154

(51) Int. Cl.
| | |
|---|---|
| *H01L 21/00* | (2006.01) |
| *H01L 21/66* | (2006.01) |
| *H01L 51/00* | (2006.01) |
| *H01L 51/52* | (2006.01) |
| *H01L 51/56* | (2006.01) |
| *G01B 7/06* | (2006.01) |

(52) U.S. Cl.
CPC .............. *H01L 22/26* (2013.01); *G01B 7/066* (2013.01); *H01L 22/12* (2013.01); *H01L 51/0021* (2013.01); *H01L 51/5203* (2013.01); *H01L 51/56* (2013.01); *H01L 2251/558* (2013.01)

(58) Field of Classification Search
CPC ..... G01B 7/066; H01L 22/26; H01L 51/0021; H01L 51/5203; H01L 51/56
See application file for complete search history.

(56) References Cited

FOREIGN PATENT DOCUMENTS

| | | |
|---|---|---|
| JP | 2007-024909 A | 1/2007 |
| JP | 2014-062310 A | 4/2014 |
| KR | 10-2014-0136159 A | 11/2014 |

OTHER PUBLICATIONS

Korean Office Action dated Mar. 20, 2017 for corresponding Korean Patent Application No. 10-2016-0033992.

*Primary Examiner* — Richard Booth
(74) *Attorney, Agent, or Firm* — Typha IP LLC

(57) ABSTRACT

In a method for manufacturing an organic EL display device, an underlying film is formed on each of a plurality of crystal oscillators of a film thickness measuring device. A crystal oscillator to be used for thickness measurement of the thin film is selected from the plurality of crystal oscillators with the underlying film formed thereon. The thin film is formed on the selected crystal oscillator and the substrate of the organic EL display device. A thickness of the thin film formed on the substrate of the organic EL display device is measured on the basis of a thickness of the thin film formed on the selected crystal oscillator, while forming the thin film. The crystal oscillator used for thickness measurement of the thin film is changed for another crystal oscillator on the basis of the thickness of the thin film formed on the selected crystal oscillator.

6 Claims, 7 Drawing Sheets

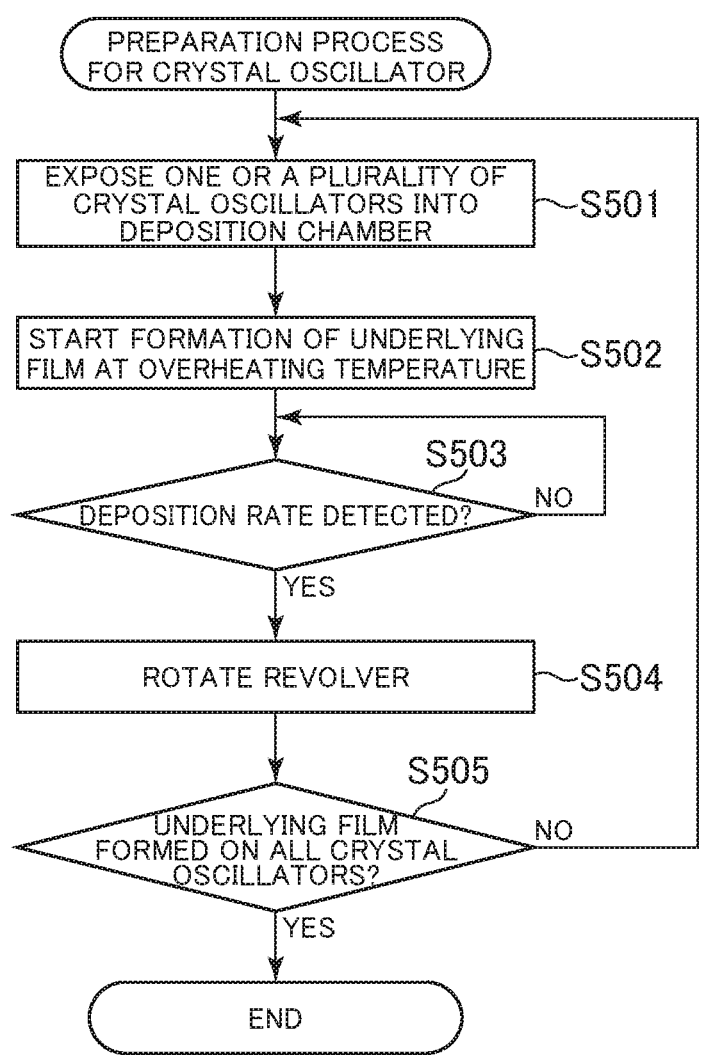

METHOD FOR MANUFACTURING ORGANIC EL DISPLAY DEVICE, AND FILM THICKNESS MEASURING DEVICE

CROSS-REFERENCE TO RELATED APPLICATION

The present application claims priority from Japanese application JP2015-062154 filed on Mar. 25, 2015, the content of which is hereby incorporated by reference into this application.

BACKGROUND OF THE INVENTION

1. Field of the Invention

The present invention relates to a method for manufacturing an organic EL display device, and a film thickness measuring device.

2. Description of the Related Art

In a process of manufacturing an organic EL display device, in some cases, vapor deposition may proceed while the thickness of a thin film is measured with a film thickness measuring device. For example, a thin film of a metal such as magnesium (Mg) may be used along with a transparent conductive material, as an electrode material of the organic EL display device. The thickness of the metal film has an influence on light emission and therefore needs to be controlled with high accuracy. Thus, the metal film may be deposited while the thickness of the metal film is measured with a film thickness measuring device.

As such a film thickness measuring device, a film thickness measuring device utilizing a crystal oscillator is known (for example, JP 2007-024909 A). Since the crystal oscillator is installed to be exposed into a deposition chamber, a thin film is also formed on the surface of the crystal oscillator in the vapor deposition process on the substrate of the organic EL display device. As the thin film is formed on the surface of the crystal oscillator, the natural frequency of the crystal oscillator changes. Therefore, by measuring the natural frequency of the crystal oscillator, the thickness of the thin film on the crystal oscillator is calculated. On the basis of the thickness of the thin film on the crystal oscillator, the thickness of the thin film formed on the substrate of the organic EL device is calculated.

SUMMARY OF THE INVENTION

In order to accurately calculate the thickness of the thin film formed on the substrate of the organic EL display device by the above method, the vapor deposition on the substrate of the organic EL display device and the vapor deposition on the crystal oscillator need to start at the same time. However, some materials of the thin film used in the organic EL display device cannot easily form a film on the surface of the crystal oscillator. For example, Mg used as the above-described electrode material cannot easily form a thin film on the crystal oscillator. In the case of forming a thin film of such a material on the substrate of the organic EL display device, even when the vapor deposition on the substrate of the organic EL display device starts, the vapor deposition on the crystal oscillator does not start and therefore the film thickness cannot be measured accurately. Thus, in such a case, it is effective to form an underlying film on the surface of the crystal oscillator with a material to which the material of the thin film can easily attach, before starting the vapor deposition on the substrate of the organic EL display device (hereinafter, the process of forming the underlying film is referred to as a preparation process).

The thickness of the thin film on the crystal oscillator gradually increases as the number of times the crystal oscillator is used increases. When the thickness of the thin film on the crystal oscillator exceeds a certain level, it is difficult accurately calculate the film thickness, using this crystal oscillator. Therefore, when the thickness of the thin film reaches a certain level, the crystal oscillator used for measuring the film thickness needs to be a new one. However, when the crystal oscillator is replaced, the foregoing preparation process is needed again and therefore the production efficiency of the organic EL display device drops.

An object of the invention is to provide a method for manufacturing an organic EL display device that can improve production efficiency, and a film thickness measuring device.

(1) In view of the foregoing problem, according to an aspect of the invention, a method for manufacturing an organic EL display device in which a thin film is formed on a substrate of an organic EL display device, using a vapor deposition device having a film thickness measuring device, includes: forming an underlying film on each of a plurality of crystal oscillators of the film thickness measuring device, with a material of the thin film or a material with higher adhesiveness to the crystal oscillators than the material of the thin film; selecting a crystal oscillator to be used for thickness measurement of the thin film, from the plurality of crystal oscillators with the underlying film formed thereon; forming the thin film on the selected crystal oscillator and the substrate of the organic EL display device, by the vapor deposition device; measuring a thickness of the thin film formed on the substrate of the organic EL display device on the basis of a thickness of the thin film formed on the selected crystal oscillator, while forming the thin film; and changing the crystal oscillator used for thickness measurement of the thin film for another crystal oscillator of the plurality of crystal oscillators, when the thickness of the thin film formed on the selected crystal oscillator or a matter correlating with this thickness meets a predetermined condition.

(2) In view of the foregoing problem, according to another aspect of the invention, a film thickness measuring device includes: a holder to which a plurality of crystal oscillators is attached; and a cover for covering the plurality of crystal oscillators attached to the holder. Two or more crystal oscillators, of the plurality of crystal oscillators, can be exposed from the cover and the rest of the crystal oscillators can be covered. As the cover and the holder move relatively to each other, at least a part of the two or more crystal oscillators can be changed.

BRIEF DESCRIPTION OF THE DRAWINGS

FIG. 5 shows the flow of a preparation process for the crystal oscillator in the first embodiment.

DETAILED DESCRIPTION OF THE INVENTION

Hereinafter, a method for manufacturing an organic EL display device, and a film thickness measuring device for a crystal oscillator according to a first embodiment of the invention will be described with reference to the drawings.

First Embodiment

Figure 1:
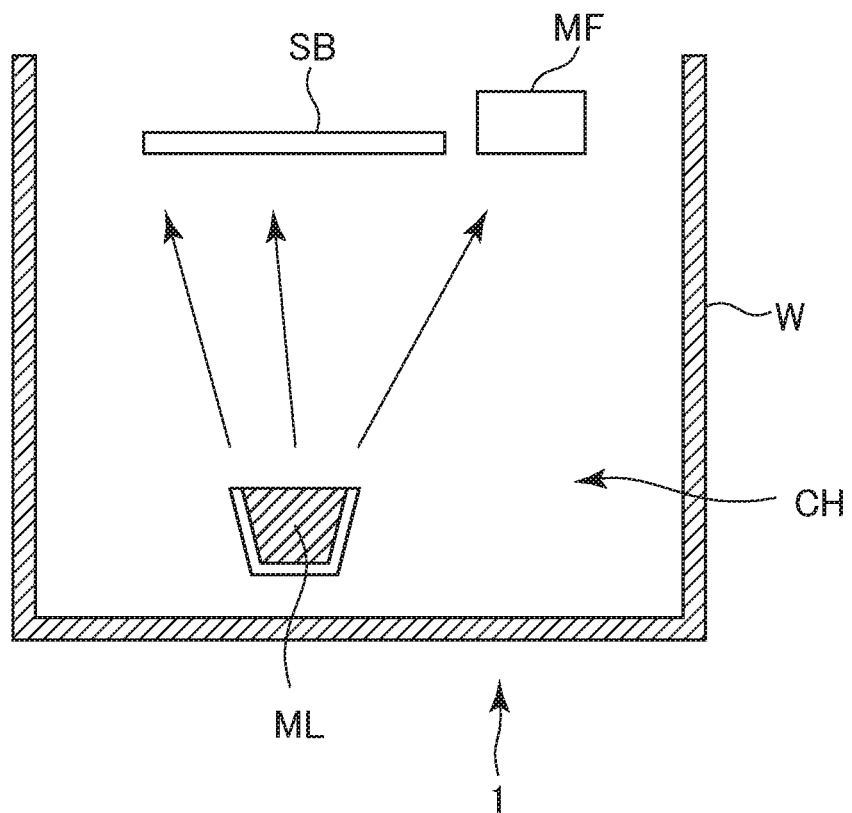
FIG. 1 is a schematic view of a vapor deposition device according to a first embodiment.

FIG. 1 is a schematic view of a vapor deposition device according to the first embodiment.

As Shown in FIG. 1, a deposition crucible ML as a deposition source, and an organic EL element substrate SB (deposition target substrate) where a predetermined metal thin film is to be formed on the surface, are arranged inside a deposition chamber CH of the vapor deposition device 1. The deposition chamber CH is a space isolated by an outer wall W of the vapor deposition device 1, and is reduced in pressure and vacuum-exhausted by a vacuum exhaust system, not shown.

In the deposition crucible ML, a deposition material is stored inside the crucible, and by a heater arranged around the crucible, the deposition material is heated and evaporated and thus dispersed inside the deposition chamber CH. The vapor of the metal from the deposition crucible ML is cast onto the deposition target substrate, forming a thin film of the deposition material.

A film thickness measuring device MF in this embodiment includes a plurality of crystal oscillators accommodated in a revolver-type case. At the time of vapor deposition, one of the accommodated crystal oscillators is exposed inside the deposition chamber CH, and a thin film of the deposition on material is formed on the surface of the crystal oscillator as well as on the deposition target substrate. The film thickness measuring device MF detects the amount of change in the natural frequency of the crystal oscillator and thereby calculates the thickness of the metal thin film deposited on the deposition target substrate.

Here, in the process of manufacturing the organic EL display device, a metal which cannot easily form a thin film on the crystal oscillator, such as magnesium (Mg), for example, may sometimes be used. In the method for manufacturing the organic EL display device in this embodiment, in order to efficiently perform vapor deposition of such a metal, a preparation process of forming an underlying film which makes it easier for the metal to be deposited on the crystal oscillator is provided. As the underlying film, a metal with good adhesiveness to the metal (magnesium or the like) that cannot easily form the thin film may be used. Magnesium or the like may be formed as the underlying film, or another metal (for example, silver) that adheres to the crystal oscillator more easily than magnesium or the like, or an organic film may be used. In the latter case of another metal or an organic film, a material on which magnesium or the like can easily be deposited (that is, a material with good adhesiveness) at the temperature in the vapor deposition process of the metal thin film on the organic EL element substrate SB may be used. The metal which adheres to the crystal oscillator more easily than magnesium or the like (metal with high adhesiveness to the crystal oscillator) refers to a metal which forms a film with a greater film thickness on the crystal oscillator when deposited under the same conditions.

Figure 2:
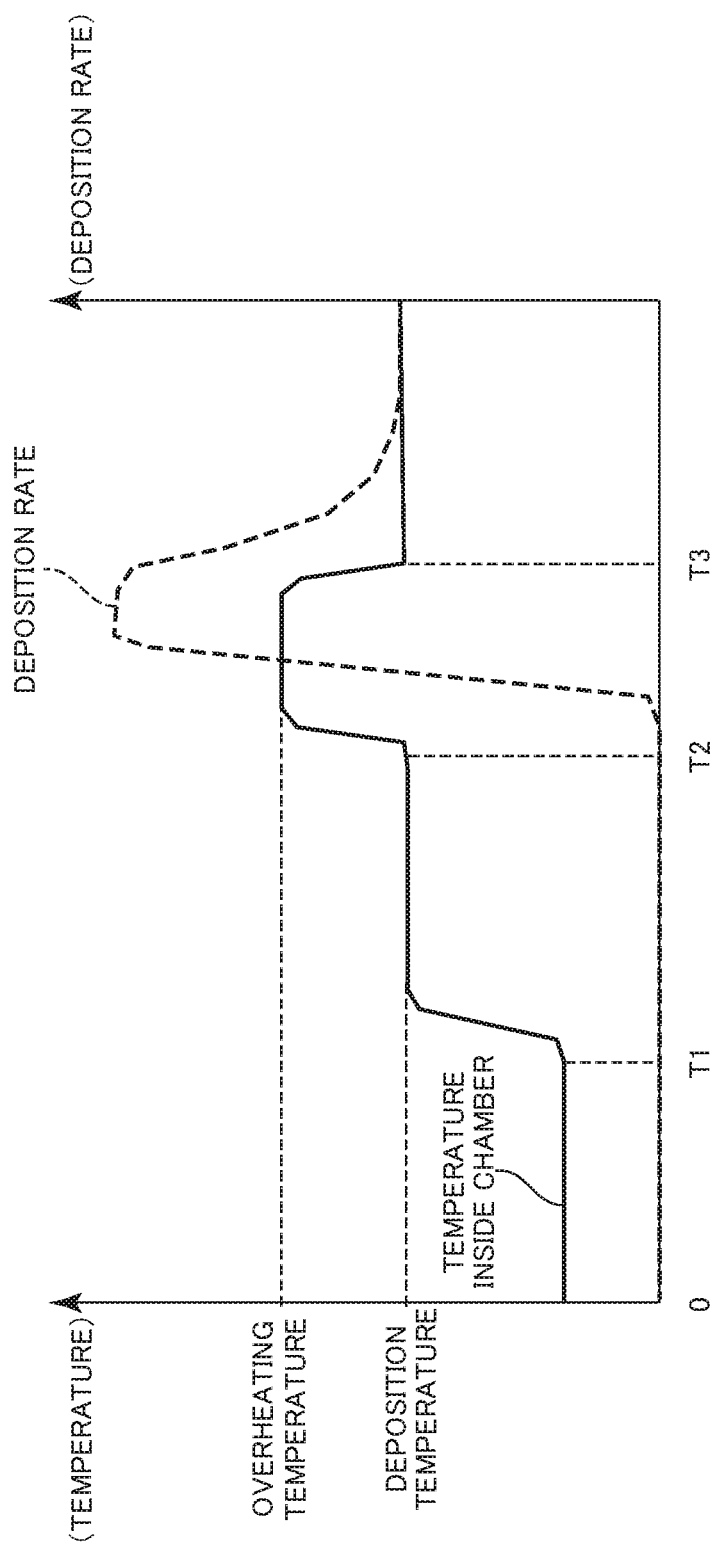
FIG. 2 is a graph showing temperature within a deposition chamber and changes with time in the deposition rate of magnesium on a crystal oscillator.

FIG. 2 is a graph showing temperature within the deposition chamber CH and changes with time in the deposition rate of magnesium on the crystal oscillator, and is a view for explaining the preparation process for the crystal oscillator in the first embodiment.

First, at a time point T1 in FIG. 2, evaporation of the deposition material is not started yet and no metal thin film is formed on the surface of the crystal oscillator. During the period between time points T1 and T2, a deposition temperature (first temperature) at which the magnesium is evaporated to form a thin film on the organic EL element substrate SB is set. During the period between time points T2 and T3, an overheating temperature (second temperature) which is higher than the deposition temperature is set. This overheating temperature is higher than the deposition temperature by 50 degrees or more and 70 degrees or less. After T3, the deposition temperature is restored from the overheating temperature.

As shown in FIG. 2, during the period between the time points T1 and T2, the deposition rate is maintained at zero and adhesion of the magnesium to the surface of the crystal oscillator is not started. However, since the deposition source is set to the overheating temperature during the period between T2 and T3, the deposition rate quickly rises and adhesion of the magnesium to the crystal oscillator starts, forming an underlying film. Subsequently, after T3, as the deposition source is returned to the deposition temperature from the overheating temperature, the deposition rate of the magnesium settles at a predetermined level and the magnesium is stably deposited on the crystal oscillator with the underlying film of the magnesium already formed.

That is, the preparation process for the crystal oscillator in this embodiment is the process of forming an underlying film of magnesium by exposing one or a plurality of crystal oscillators into the deposition chamber CH under an overheating temperature condition, separately from the organic EL element substrate SB, which is a target on which a metal thin film is to be formed. By thus adopting the overheating temperature at which the evaporation speed of the metal material increases, a thin film can be smoothly formed on the crystal oscillator.

The film thickness measuring device MF in this embodiment will be described in detail below.

Figure 3A:
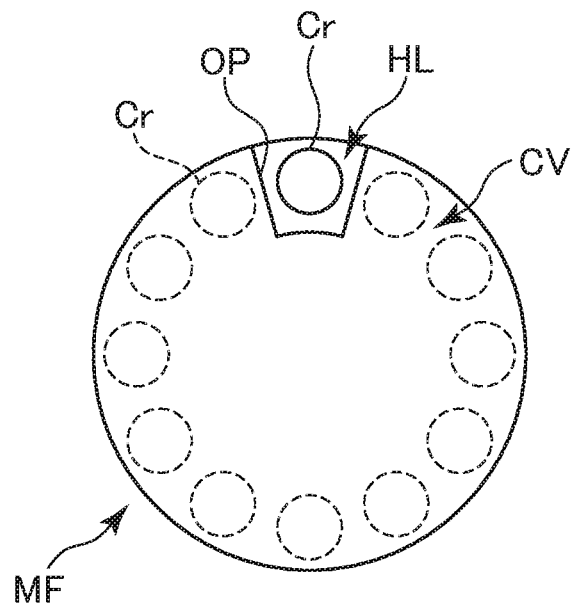
FIG. 3A shows the state of a film thickness measuring device used in the vapor deposition device according to the first embodiment.
Figure 3B:
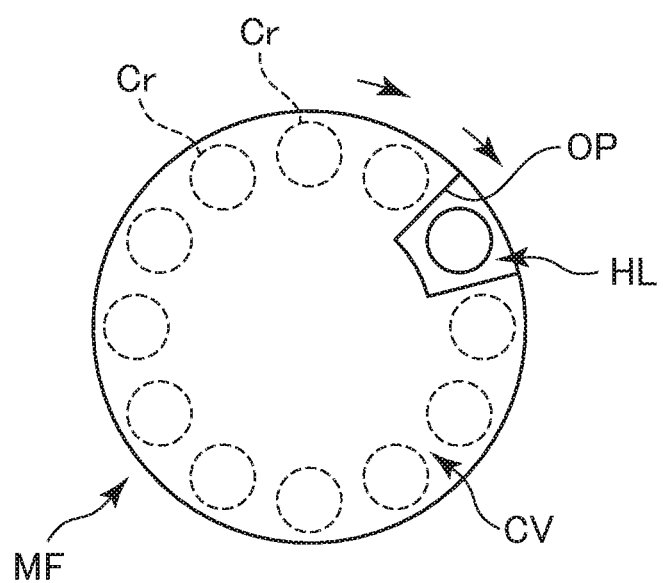
FIG. 3B shows the state of the film thickness measuring device used in the vapor deposition device according to the first embodiment.

FIGS. 3A and 3B are schematic top views of the film thickness measuring device MF in this embodiment. As shown in FIG. 3A, the film thickness measuring device MF includes a holder HL holding a plurality of crystal oscillators Cr, and a cover CV covering the holder HL.

In the cover CV, an opening OP is formed corresponding to the position of each of the plurality of crystal oscillators Cr. In the cover CV, the opening OP for exposing one crystal oscillator Cr is formed. As shown in FIG. 3B, as the cover CV rotates relatively to the holder HL, one of the crystal oscillators Cr is exposed. After an underlying film is formed on each of the plurality of crystal oscillators Cr attached to the holder HL in the preparation process for the crystal oscillators Cr, the crystal oscillators Cr are exposed one by one and used for measurement of film thickness in the vapor deposition process on the organic EL element substrate SB. When the thickness of the thin film on the crystal oscillator Cr or a matter correlating with this thickness satisfies a predetermined condition (for example, when the thickness of the thin film reaches a predetermined upper limit value), the cover CV rotates to expose another crystal oscillator Cr that is unused, and the vapor deposition process on the organic EL element substrate SB is continued.

Figure 4A:
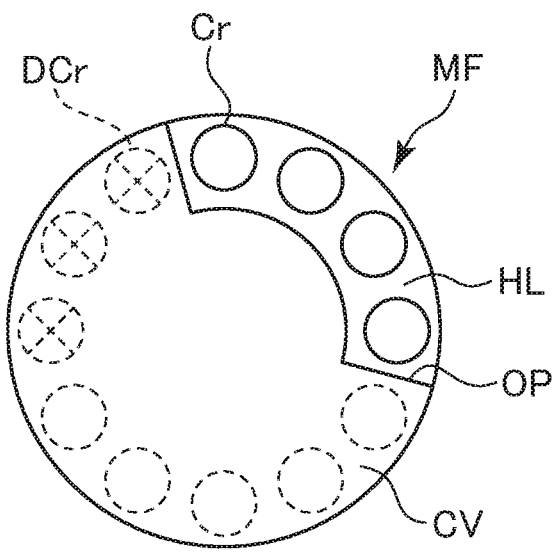
FIG. 4A shows the state of a modification of the film thickness measuring device used in the vapor deposition device according to the first embodiment.
Figure 4B:
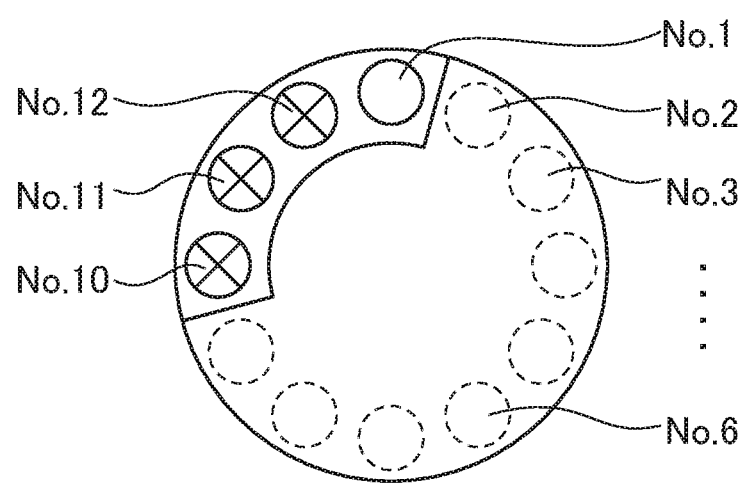
FIG. 4B shows the state of the modification of the film thickness measuring device used in the vapor deposition device according to the first embodiment.

FIGS. 4A and 4B are schematic top views showing a modification of the film thickness measuring device MF in this embodiment. In the film thickness measuring device MF according to the modification of FIGS. 4A and 4B, a plurality of crystal oscillators Cr is attached to a holder HL, and a cover CV covering these components is provided. Four crystal oscillators Cr are exposed from the cover CV, and as the cover CV moves relatively to the holder HL, apart (or all) of the exposed crystal oscillators can be changed. In the cover CV, an opening OP for simultaneously exposing a plurality of crystal oscillators Cr is formed. Dummy crystal oscillators DCr are arranged in a number one fewer than the number of the crystal oscillators exposed through the opening OP.

In the film thickness measuring device MF according to the modification of FIGS. 4A and 4B, an underlying film is formed simultaneously on the plurality of crystal oscillators Cr exposed through the opening OP (crystal oscillators of No. 1 to No. 4) in the preparation process for the crystal oscillators Cr. Therefore, the preparation process for the crystal oscillators becomes more efficient than in the case of FIGS. 3A and 3B. Specifically, after an underlying film is formed in the state where the crystal oscillators Cr of No. 1 to No. 4 are exposed, the cover CV is rotated to expose the crystal oscillators Cr of No. 5 to No. 8 through the opening OP, and subsequently the cover CV is rotated to expose the crystal oscillator Cr of No. 9 and the dummy crystal oscillators DCr arranged at the positions of No. 10 to No. 12.

In the vapor deposition process on the organic EL element substrate SB, the crystal oscillators Cr are used one by one. Therefore, first, the cover CV is rotated to expose the dummy crystal oscillators DCr at the positions of No. 10 to No. 12 and the crystal oscillator Cr of No. 1 through the opening OP, and subsequently the cover CV is rotated clockwise by 30 degrees each so that the crystal oscillators Cr are used in order.

At the positions of the dummy crystal oscillators DCr, the dummy crystal oscillators DCr need not necessarily be arranged, and the crystal oscillators Cr may be arranged, similarly to the positions of No. 1 to No. 9.

The cover CV of the film thickness measuring device MF in this embodiment is provided with the opening OP and moved relatively to the holder HL to switch the crystal oscillators Cr to be exposed in order. However, this configuration is not limiting. For example, in the film thickness measuring device MF, the cover CV may be fixed to the holder HL, a plurality of openings OP may be formed corresponding to each position where the plurality of crystal oscillators Cr is fixed, and a shield (shutter) which can open and close the openings OP may be arranged. In this case, in the preparation process for the crystal oscillators Cr, a part. (or all) of the plurality of openings OP is opened so as to form an underlying film, and in the vapor deposition process on the organic EL element substrate SB, the crystal oscillators Cr are exposed one by one in order through the plurality of openings OP and used for measurement of film thickness.

Also, the film thickness measuring device MF may have a first cover and a second cover. The first cover may be configured to cover the holder HL but have an opening at each position corresponding to the plurality of crystal oscillators Cr. The second cover may be configured to have an opening at a position corresponding to one crystal oscillator Cr while covering the rest of the crystal oscillators Cr, and to be movable relatively to the holder HL in such a way that the position of the opening in the second cover changes.

FIG. 5 shows the flow of the preparation process for the crystal oscillator in this embodiment. As shown in FIG. 5, first, in S501, one or a plurality of crystal oscillators Cr is exposed into the deposition chamber CH. Then, the deposition source and the inside of the deposition chamber CH are set to the overheating temperature, thus starting the formation of an underlying film (S502).

Then, if the deposition rate on the crystal oscillator Cr exposed inside the deposition chamber CH is detected after measurement of its natural frequency (if YES holds in S503), the temperature of the deposition source and the temperature inside the deposition chamber CH are changed to the deposition temperature from the overheating temperature. After the deposition rate is stabilized, the revolver of the film thickness measuring device MF is rotated. If the deposition rate cannot be detected (if NO holds in S503), the formation of the underlying film at the overheating temperature is continued.

After the revolver is rotated, whether the formation of the underlying film is finished on all the crystal oscillators accommodated in the film thickness measuring device MF or not is determined in S505. If any crystal oscillator on which the formation of the underlying film is not finished yet is left, the flow returns to S501 to repeat similar processing (if NO holds in S505). Meanwhile, if the formation of the underlying film is finished on all the crystal oscillators, the preparation process for the crystal oscillator ends.

Figure 6:
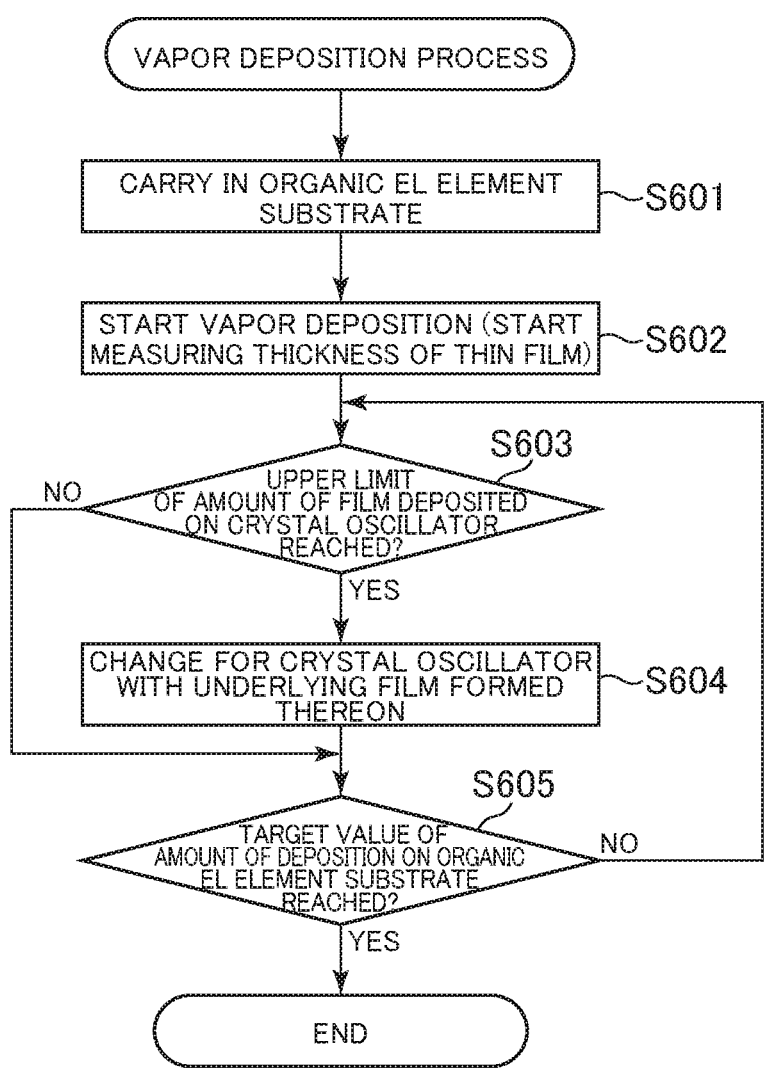
FIG. 6 shows the flow of a vapor deposition process in the first embodiment.

FIG. 6 shows the flow of the vapor deposition process in which a thin film is formed on one organic EL element substrate SB in this embodiment.

As shown in FIG. 6, in S601, the organic EL element substrate SB is carried and exposed into the deposition chamber CH. Subsequently, in S602, vapor deposition on the organic EL element substrate SB is started. In this S602, the crystal oscillator Cr with an underlying film formed thereon is exposed from the film thickness measuring device MF and measurement of the thickness of the thin film deposited on the organic EL element substrate SB is started as well.

In S605, whether the amount of deposition on the organic EL element substrate SB has reached a target value or not is determined by measuring the natural frequency of the crystal oscillator Cr. If the target value has been reached (YES), the vapor deposition process ends. However, the target value has not been reached (NO), the processing of S602 (vapor deposition and measurement of the deposited thin film) is continued.

While the processing of S602 is continued, whether the amount of the film deposited on the crystal oscillator Cr has reached an upper limit value or not is determined (S603). If the upper limit value has been reached, the revolver of the film thickness measuring device MF is rotated in order to change the current crystal oscillator Cr for another unused crystal oscillator with an underlying film formed thereon.

Since the process of manufacturing the organic EL display device in this embodiment includes the preparation process for the crystal oscillator by the vapor deposition device 1 having the film thickness measuring device MF as shown in FIG. 3A and the like, a crystal oscillator with an underlying film already formed thereon is prepared at the time of changing the crystal oscillator, and a thin film can be formed immediately without delay in the vapor deposition process. Thus, production efficiency can be improved.

In S603 in this embodiment, the crystal oscillator is changed if the thickness of the thin film formed on the crystal oscillator has exceeded a predetermined value. However, the invention is not limited to this configuration. The crystal oscillator may be changed for another crystal oscillator with an underlying film formed thereon, if a matter correlating with the thickness of the thin film on the crystal oscillator meets a predetermined condition. Specifically, the matter correlating to the thickness of the thin film on the crystal oscillator may be the duration of use of the crystal oscillator or the number of times the crystal oscillator is used (number of organic EL element substrates SB on which vapor deposition is carried out). The crystal oscillator may be changed if the duration of use of the crystal oscillator has passed a predetermined time or if the number of times the crystal oscillator is used (number of organic EL element substrates SB on which vapor deposition is carried out) has exceeded a predetermined value.

Figure 7:
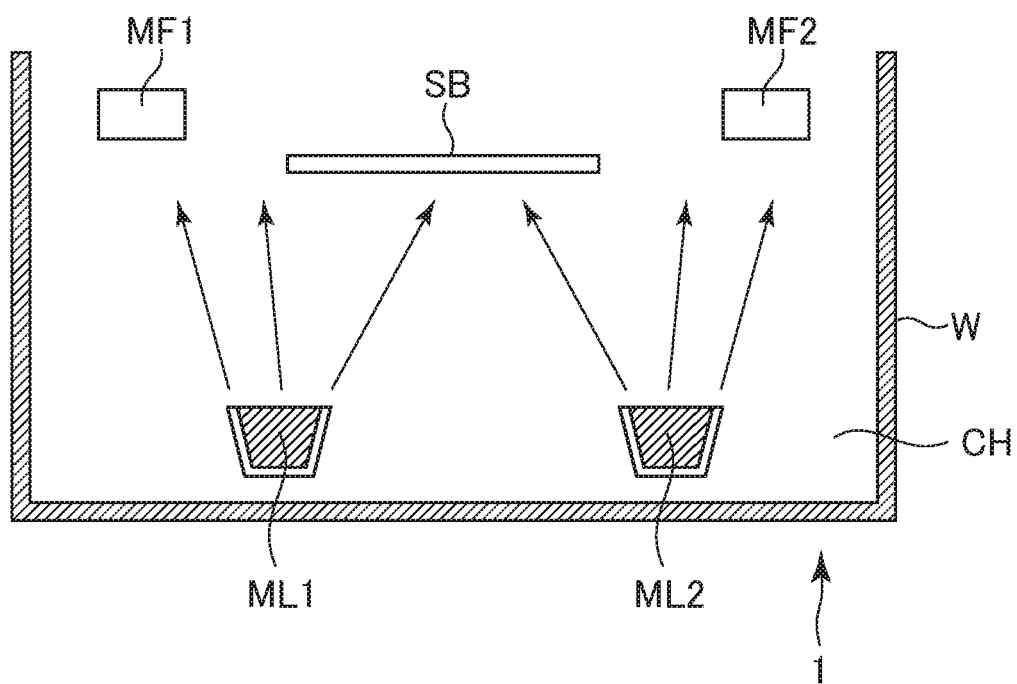
FIG. 7 is a schematic view of a vapor deposition device according to a modification of the first embodiment.

FIG. 7 shows the process of manufacturing an organic EL display device according to a second embodiment. On the organic EL element substrate SB shown in FIG. 7, a thin film of an alloy made up of deposition materials from two deposition sources (deposition crucible ML1, deposition crucible ML2) is formed.

Specifically, silver (Ag) is evaporated from the deposition crucible ML1 and magnesium (Mg) is evaporated form the deposition crucible ML2. On the organic EL element substrate SB, a thin film of a silver-magnesium allow with a ratio of silver:magnesium=5:1.

In the preparation process for the crystal oscillator in the second embodiment, an underlying film of silver and an underlying film of magnesium may be formed on film thickness measuring devices MF1, M2, respectively. Also, an underlying film of the same kind of metal may be formed on both of the film thickness measuring devices MF1, MF2. Alternatively, an underlying film of a silver-magnesium alloy may be formed.

The vapor deposition processing in the second embodiment may be executed, controlling the content ratio in the alloy formed on the organic EL element substrate SB by causing a thin film of silver to be formed on the film thickness measuring device MF1 arranged near the silver deposition crucible ML1, and causing a thin film of magnesium to be formed on the film thickness measuring device MF2 arranged near the magnesium deposition crucible ML2. Alternatively, it is possible to arrange only the film thickness measuring device MF1 inside the deposition chamber CH so as to measure the thickness of a thin film of a silver-magnesium alloy. In both cases, since the preparation process for the crystal oscillator by the vapor deposition device 1 having the film thickness measuring device MF is provided, a thin film can be formed immediately without delay in the vapor deposition process and therefore production efficiency can be improved.

The invention is not limited to the above embodiments and can be carried out with various modifications. A person skilled in the art can readily think of various changes and modifications within the conceptual scope of the invention, and such changes and modifications are understood as falling within the scope of the invention. For example, any additions, deletions or design changes of components, or additions, omissions or condition changes of processes, suitably made to each of the embodiments by a person skilled in the art, are included in the scope of the invention as long as the main points of the invention are maintained.

What is claimed is:

1. A film thickness measuring device comprising:
   m (m is a natural number) crystal oscillators, each of the m crystal oscillators having an underlying film;
   a holder to which the m crystal oscillators is attached; and
   a cover for covering the m crystal oscillators attached to the holder;
   wherein n (n is a natural number and not less than two and less than m) crystal oscillators in the m crystal oscillators can be exposed from the cover concurrently, and the rest of the crystal oscillators can be covered concurrently,
   as the cover and the holder move relatively to each other, at least a part of the n crystal oscillators can be changed, and
   the m crystal oscillators include n−1 dummy crystal oscillators.

2. The film thickness measuring device according to claim 1, wherein
   the cover covers the holder and has an opening corresponding to the n crystal oscillators, and
   the cover and the holder are movable relatively to each other so that the n crystal oscillators attached to the holder are exposed through the opening.

3. The film thickness measuring device according to claim 1, wherein
   the underlying film includes a metal material.

4. The film thickness measuring device according to claim 3, wherein
   the metal material is magnesium or silver.

5. The film thickness measuring device according to claim 3, wherein
   the metal material is a silver and magnesium.

6. The film thickness measuring device according to claim 3, wherein
   the metal material is a silver-magnesium alloy.

* * * * *